(12) United States Patent
Peinsipp et al.

(10) Patent No.: US 9,134,356 B2
(45) Date of Patent: Sep. 15, 2015

(54) METHOD AND DEVICE FOR PROCESSING DATA OR SIGNALS WITH DIFFERENT SYNCHRONIZATION SOURCES

(75) Inventors: Dietmar Peinsipp, Graz (AT); Peter Priller, Judendorf-Strassengel (AT)

(73) Assignee: AVL List GmbH, Graz (AT)

( * ) Notice: Subject to any disclaimer, the term of this patent is extended or adjusted under 35 U.S.C. 154(b) by 1100 days.

(21) Appl. No.: 12/073,363

(22) Filed: Mar. 4, 2008

(65) Prior Publication Data

US 2008/0221838 A1    Sep. 11, 2008

(30) Foreign Application Priority Data

Mar. 6, 2007   (AT) ............................ GM136/2007 U

(51) Int. Cl.
*G06F 1/12* (2006.01)
*G01R 31/00* (2006.01)

(52) U.S. Cl.
CPC . *G01R 31/00* (2013.01); *G06F 1/12* (2013.01)

(58) Field of Classification Search
CPC ..................................................... G06F 15/00
USPC ............... 702/74, 79, 89, 124, 126, 176, 178, 702/189; 714/731; 713/375; 370/507
See application file for complete search history.

(56) References Cited

U.S. PATENT DOCUMENTS

| | | | |
|---|---|---|---|
| 5,717,704 | A | 2/1998 | Rosenfeld |
| 5,896,524 | A | 4/1999 | Halstead, Jr. et al. |
| 6,279,058 | B1 * | 8/2001 | Gulick ............................ 710/58 |
| 6,687,319 | B1 * | 2/2004 | Perino et al. ................... 375/367 |
| 6,789,224 | B2 * | 9/2004 | Miura ............................. 714/744 |
| 7,100,099 | B2 * | 8/2006 | Niijima ......................... 714/744 |
| 2004/0128528 | A1 * | 7/2004 | Poisner .......................... 713/200 |
| 2004/0250151 | A1 * | 12/2004 | Abendroth et al. ............ 713/400 |
| 2005/0149801 | A1 | 7/2005 | Oshima |
| 2005/0268020 | A1 * | 12/2005 | James ............................ 710/305 |
| 2006/0074600 | A1 * | 4/2006 | Sastry et al. ................... 702/187 |
| 2006/0156126 | A1 * | 7/2006 | Oshima ......................... 714/731 |

FOREIGN PATENT DOCUMENTS

| | | |
|---|---|---|
| AT | 413308 | 1/2006 |
| AT | 501536 | 9/2006 |
| AT | 009243 U2 | 6/2007 |
| EP | 0491998 | 7/1992 |

OTHER PUBLICATIONS

English Abstract of EP0491998.
English Abstract of AT501536.
English abstract of Austrian Patent No. AT-009 243 U2.
European Search Report issued in Application No. EP1967859 (Jul. 28, 2008).

* cited by examiner

*Primary Examiner* — Janet Suglo
*Assistant Examiner* — Michael Dalbo
(74) *Attorney, Agent, or Firm* — Dykema Gossett PLLC

(57) ABSTRACT

In processing devices, in particular in measuring, test or control units for the drivetrain or components thereof, it is often necessary to combine signals or data of different synchronization sources with one another or to process them whilst maintaining the original temporal relation. In order to achieve this, the signals or data have hitherto often been synchronized to a specific clock source, but this is frequently not possible. Therefore, a method and a device are specified which enable the processing of data or signals with different synchronization sources in a processing device by virtue of the fact that a dedicated time level is introduced for each synchronization source in the processing device, the temporal reference of the associated data and signals being retained in the time levels. The signals and data are processed in the time levels with the temporal original reference being maintained.

20 Claims, 1 Drawing Sheet

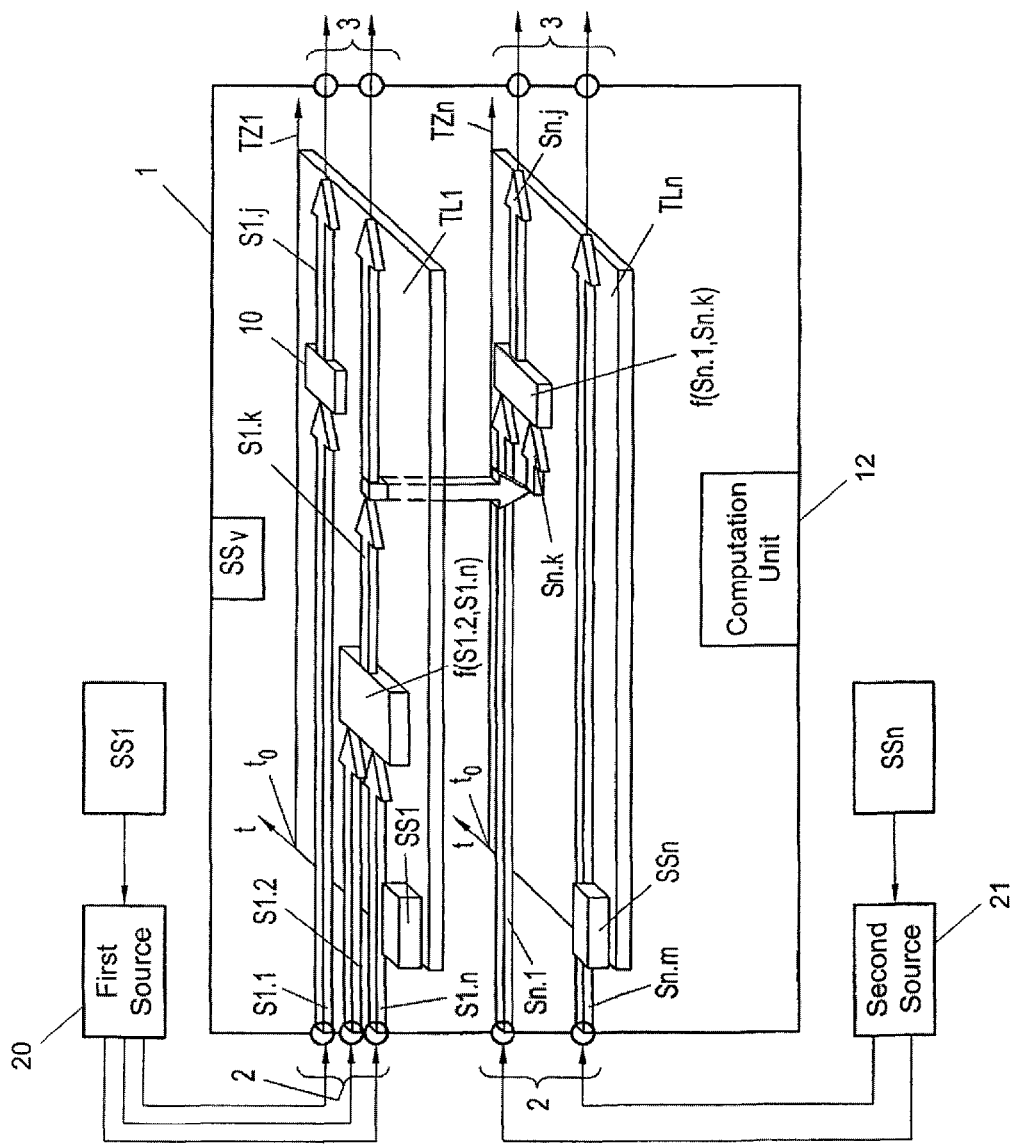

METHOD AND DEVICE FOR PROCESSING DATA OR SIGNALS WITH DIFFERENT SYNCHRONIZATION SOURCES

The substantive invention relates to a method and a device for processing data or signals with different synchronization sources in a processing device.

In a processing device, in particular in a measuring, test or control unit for the drivetrain or components thereof, such as e.g. an automation system, a control device or a measurement data evaluation or recording unit, it is often necessary to combine measurement data from different sources with one another. In this case, measurement data from different sources can be synchronized to different clock sources, e.g. by sampling and digitization. In order that differently synchronized measurement data can then be combined among one another or with one another in a superordinate processing device, it is necessary to maintain the temporal relation of the measurement data or to relate the respective measurement data temporally to one another. That can therefore mean, for example, combining a measurement datum of a source having a first clock source with the temporally associated measurement datum of a source having a second clock source. If the temporal relation of the two measurement data is not correct, then the combination of these two measurement data will yield an incorrect result since measurement data that did not arise at the same point in time (as viewed from a global absolute time) are combined. Furthermore, the temporal relation of measurement data of a source with a clock source must also be maintained in the superordinate processing device in order to ensure that they can be combined among one another temporally correctly. Such measurement data have hitherto been related to one another in such a way that the measurement data of one source have been synchronized to the other source, with the relation to the original synchronization source being lost, however. Another known possibility is to synchronize the source itself, e.g. to synchronize one bus system to the other, but this is not always possible.

In order to be able to understand e.g. the dynamic processes which are necessary for the emission-optimized design of engine functions, e.g. on an engine test bed, it is necessary, for example, for measurement data from different, separate apparatuses, equipped with different data acquisition devices and bus systems, to be combined, synchronized and evaluated with precise temporal assignment. At the present time this is accomplished only incompletely and presents considerable difficulties in particular in the emission optimization of dynamic processes. In this case, a particular importance is attached to the data from engine control units (ECU), which have to be brought temporally into accord with other test bed data acquired with high accuracy. The problem here resides in the time delays that occur in ECU systems as a result of the bus systems used, which time delays cannot be reduced.

Moreover, current automation systems meet the future requirements of modern test beds with regard to the standardization of a plurality of time servers (e.g. active directory time servers, a plurality of test bed systems as time master, or data buses with mutually asynchronous clock sources) only to a limited extent.

Example: a synchronous system, called system A, comprises inter alia a plurality of electronic control units (ECU) on a FlexRay network. System A might serve e.g. for controlling a power pack (engine+transmission). Nodes (that is to say e.g. components linked in this network) in this system are strictly synchronized to one another and the clock source is usually a specific ECU. A synchronization of this system to a different clock, e.g. an external clock source, is undesirable or even impossible. A second system, called system B, would be for example a real-time Ethernet network with measuring and control technology at the test bed. This system B is in turn inherently strictly synchronized, but with no temporal association whatsoever with the FlexRay network of system A. A cross-synchronization of the clocks between these systems is not possible, therefore. Nevertheless, under certain circumstances, data or signals from the different systems that are not synchronous with one another have to be combined with one another temporally correctly (that is to say e.g. relative to an absolute time). In this case, however, the original signal or datum in the associated system must, of course, also remain with the original synchronization since it may also be required in said system.

Therefore, it is an object to specify a method and a device for processing signals with different synchronization sources in a processing device which can be used to process data or signals of different synchronization sources without any problems and without losing the original temporal relation.

This object is achieved for the method and the device according to the invention by virtue of the fact that a time level is introduced for each synchronization source in the processing device, wherein the clock of the synchronization source is used as source clock in each time level and the data or signals assigned to said synchronization source are handled, that is to say read in and/or processed and/or output, synchronously with the source clock of the synchronization source in the associated time level.

In contrast to conventional methods, then, here no attempt is made to synchronize different independent systems to one another or to a specific clock source. This would actually not be desired, nor would it be possible, on account of the independence of said systems. Rather, the temporal relations of the data and signals are retained in the associated time level and may also be combined with one another in a simple manner within the time level likewise whilst maintaining the temporal relation. This method also makes it possible to integrate signals having different degrees of temporal jitter, or even real-time and non-real-time signals in a processing device, without losing the temporal original relation. In this case, this method is also independent of the respective clock rate of the system under consideration and can therefore process (also simultaneously) both acyclically and cyclically synchronous systems. The concept could therefore be extended to any desired number of systems which are inherently synchronous but asynchronous with the other systems.

In addition to cyclic synchronism (that is to say constant clock times of the clock source), it is also conceivable in the method according to the invention to use systems which, as seen temporally, are acyclic but nevertheless inherently synchronized. In this case, the cycle time would be variable, but it would in turn be identical for all the nodes within a system. One exemplary application would be measurement data acquisition based on a synchronization which is dependent on the crank angle of an internal combustion engine, and in the case of which therefore different clock times occur depending on the rotational speed.

According to the invention, however, two signals of different time levels can also be combined with one another by virtue of the fact that one signal is imported into the time level of the other signal and the temporal relation to the time level imported into is thus established. The two signals, which have the same time base after the importing, can be combined simply and temporally correctly. The importing can advantageously be carried out either by virtue of the fact that the signal to be imported is sampled using the source clock of the time level into which it is to be imported, or by virtue of the fact that the signal to be imported is interpolated to the source clock of the time level into which it is to be imported.

Preferably, a local absolute time is formed in a time level in order to be able to carry out time-dependent functions, such as e.g. an integration. A local absolute time can be formed in a simple manner in accordance with the relationship $TZ=t_0+TCM*CMT$, where TZ indicates the local absolute time, to indicates a start time, $T_{CM}$ indicates a time constant and CMT indicates the number of clock cycles that have elapsed since the start instant.

Data or signals of a first time level can be imported particularly simply and advantageously into a second time level by virtue of the fact that the local absolute time of the first time level is converted into the local absolute time of the second time level.

The local absolute time of the first time level is preferably converted into the local absolute time of the second time level by virtue of the fact that the time constant of the first time level is adapted to the local absolute time of the second time level. A continuous adaptation is thus achieved and this results in an adaptive conversion of the local first absolute time into a second absolute time. This conversion is therefore also able to cope with discontinuities, such as e.g. time jumps, in the absolute time since, in such a case, the conversion is simply readjusted by the adaptation. The adaptation is effected particularly simply and advantageously in accordance with the relationship $T_{CM}=(TZ_{TL2}-t_0)/CMT$.

A particularly simple conversion is already obtained by virtue of the fact that the start time of the absolute time is set at the beginning to the current local absolute time of the time level imported into. This conversion functions particularly well between time levels having identical time constants. For time levels having non-identical time constants, this conversion functions at least for short time periods. Otherwise, in this case the adaptation of the time constants can also be carried out in addition.

The substantive invention is described below with reference to schematic FIG. 1, which shows an advantageous exemplary embodiment.

FIG. 1 shows a processing device 1, which, via specific input interfaces 2, receives a series of signals or data from different signal or data sources 20, 21, e.g. from a first signal or data source 20, e.g. a network having a series of control devices that transmit signals or data S1.1, S1.2 to S1.m, and from a second signal or data source 21, e.g. a network having measuring and control technology that transmit signals or data Sn.1 to Sn.m, e.g. measurement data. In this case, each signal or data source 20, 21 has a dedicated internal (such as e.g. a clock generator) or external (such as e.g. the clock of a data bus) synchronization source SS1, SSn, such as a clock source, for example, to which all signals or data generated by said signal or data source 20, 21 are synchronized. In this case, said synchronization sources SS1, SSn are generally not temporally related to one another. Any desired number of such signal or data sources 20, 21 with associated synchronization source SS1, SSn may be present, of course, for the application of the invention. It is also conceivable for a plurality of signal or data sources 20, 21 to have the same synchronization source, whereby the signals or data of said signal or data sources 20, 21 can be handled identically with regard to the temporal synchronization in the processing device 1.

The processing device can be e.g. a control unit for the engine (ECU), the transmission, the drivetrain or the entire vehicle, or else a test bed measuring unit or a test bed automation system or control system that receives data or signals from different sources with different synchronism.

In order to be able to process the signals or data from the different signal or data sources 20, 21 in the processing device 1 whilst maintaining the respective temporal synchronization to the dedicated synchronization source SS1, SSn, in the processing device 1 a dedicated time level TL1, TLn is introduced in the processing device 1 for each synchronization source SS1 . . . SSn. All the data or signals S1, Sn of a specific synchronization source SS1, SSn are read in, processed and/or output in the associated time level TL1, TLn synchronously with the "source clock" of the synchronization source SS1, SSn of the associated signal or data source 20, 21. For this purpose, the signal or data flow between the signal or data source 20, 21 and the processing device 1 is advantageously effected temporally synchronously with the respective signal or data source 20, 21 in order not to generate any time error here.

It goes without saying that it is also possible to form a time level with the synchronization source SSv of the processing device 1. It is thereby possible e.g. for data and signals S1, Sn also to be handled, that is to say read in, recorded, processed or output, relative to the synchronization source SSv of the processing device 1.

The different time levels TL1, TLn exist in the processing device 1 in parallel with one another and ideally without any dependences. In practice, however, cross-dependences can arise, e.g. if the hardware (HW) and software (SW) in the processing device 1 cannot be parallelized arbitrarily. For example by means of corresponding prioritization of the processing threads in the SW, and by means of a performant implementation or by means of multiple processing devices (multiprocessor/multicore systems), however, this cross-dependence can be kept small and within permitted tolerances. A cross-dependence is then noticeable as temporal (negligible) jitter in the respective time level.

In the processing device 1, data and signals S1, Sn always remain at the time level TL1, TLn of their associated synchronization source SS1, SSn and thus always synchronous with their system of origin. The temporal relation of the data and signals S1, Sn is therefore always retained. The processing in the processing device 1, e.g. filtering, or combination within the time level, is in turn effected synchronously in the respective time level TL1, TLn in the processing device 1. This means that the result signals or data can also be output back once again synchronously to the associated synchronization source SS1, SSn. By way of example, in FIG. 1, the signals S1.2 and S1.n are combined with one another in accordance with a specific function f(S1.2, S1.n) to form a new signal S1.k. In this case, the function f(S1.2, S1.n) can be an arbitrary mathematical function or computation which is required for generating the new signal S1.k. The data S1.1 are filtered e.g. in a filter 10 (e.g. a low-pass filter) and are output as new signal S1.j. The new signals S1.k and S1.j are therefore likewise once again temporally synchronous with the associated synchronization source SS1 of the time level TL1. Additional latency is therefore completely avoided, which constitutes a significant advantage in the control technology. Moreover, a phase error as a result of different signal sampling instants is precluded by the completely synchronous processing.

In this case, the desired manipulations on the data and signals S1, Sn can advantageously be effected in a computation unit 12 of the processing device 1, e.g. a microprocessor or a DSP (digital signal processing) unit.

In this case, processed signals or data S1, Sn can be output via a corresponding output interface 3 of the processing device 1.

In the case of a combination of data or signals S1, Sn from different signal or data sources 20, 21, that is to say different time levels TL1, TLn, within the processing device 1, the different synchronism (phase angle, cycle time) of the data and signals S1, Sn is taken into consideration and obtained according to the invention. In this case, such a combination is once again advantageously effected in the computation unit 12.

EXAMPLE

A processing in the processing device 1 would be e.g. a combination or calculation of the general form y=f(a, b). In this case, datum or signal "a" comes from a first signal or data source A (that is to say is synchronous with A), and "b" comes from a second signal or data source B (and is therefore synchronous with B). Datum or signal "y" can then be returned both to system A (and thus synchronized to A) and to B, but also to a third signal or data source C. In this case, the number of signal or data sources 20, 21 and of data and signals is not restricted.

The combination of data or signals S1, Sn of different time levels TL1, TLn takes place by virtue of a signal being imported from one time level into the other, but at the same time continuing to exist in the original time level. This import can be effected according to various criteria, e.g. by sampling of the output signal or datum using the clock of the target time level, or in a more complicated manner by e.g. interpolation from the source clock to a target clock and therefore pre-estimation of the new value. Such an interpolation involves taking, e.g. at the clock instant of the target level, the temporally last (most recent) value of the source level and also a number k of preceding values, and effecting interpolation therefrom by way of the time difference lying between the last sampling step of the source level and the acquisition time through the target level.

The import can be effected in an import unit, which is either implemented in the computation unit 12, e.g. as microprocessor or DSP or else in hardware, or is the computation unit 12 itself.

The decision as to what signal is imported to what location can be taken automatically by the processing device 1. The time level in which the result is output may be crucial in this case. The combination can then also be effected in said time level—the combination is therefore triggered by the synchronization source assigned to said time level.

In FIG. 1, by way of example, the signal S1.$k$ is imported by the import unit from a first time level TL1 into a signal Sn.k of another time level TLn, as indicated by the arrow from time level TL1 to time level TLn in FIG. 1. As of the import, the signal S1.$k$ to be imported and the imported signal Sn.k exist in parallel in both time levels TL1, TLn, respectively related temporally to the synchronization source SS1, SSn. In time level TLn, the imported signal Sn.k can e.g. once again be combined in accordance with a function f(Sn.1, Sn.k) to form a new signal Sn.j, which is in turn synchronized to the synchronization source SSn of the associated time level TLn.

It may however also be the case, of course, that outputting in a plurality of time levels is necessary. In this case, there is a combination in each of these time levels, said combination in each case being triggered in the time level. The signals or data are here in each case imported into the other time level.

EXAMPLE y=f(a, b) has to be output in A and B. In the time level for A, therefore, "a" is used directly, "b" is used in imported fashion and they are combined by means of arithmetic function f(a, b). In the time level for B, "b" is used directly, "a" is used in imported fashion and they are likewise combined in a further arithmetic function f(a, b), but now synchronously with B.

An import of data or signals S1, Sn from one time level into another time level may e.g. also be necessary for the signal representation, diagnosis or logging of signals on or between the time levels.

The recording or the indication of values in the processing device 1 can be effected here in each case synchronously with the associated time level, or alternatively in "absolute" fashion, that is to say relative to an absolute clock, e.g. a synchronization source SSv of the processing device 1.

Each of the time levels TL1, TLn of the processing device 1 can inherently also form local absolute times TZ1, TZn, as indicated by the timelines in FIG. 1. In other words, each time level TL1, TLn has as it were a local clock. In this case, the local absolute time TZ1, TZn can be formed e.g. in accordance with the relationship $$TZ = t_0 + T_{CM} * CMT$$

where $t_0$ is a start time at the beginning of the clocking of the time level by synchronization source, CMT is the number of clock cycles since the beginning of the clocking, and $T_{CM}$ is a time constant of the clocking of the synchronization source. Such a computation is expedient e.g. for temporally cyclic systems. However, the local absolute time TZ can also be computed in any other manner desired, of course.

However, each of said local absolute times TZ1, TZn can at any time also be converted into another local absolute time, e.g. by means of a suitable projection. Of course, a signal or datum S1, Sn of one time level TL1, TLn can likewise be imported into an other time level by means of such a conversion.

The conversion of the local absolute times TZ1, TZn is necessary e.g. in the case of a connection of a real-time system, such as e.g. the data acquisition of a test bed in an automation system (=signal or data source), to a non-real-time system, such as e.g. an operating system (such as e.g. Windows) on which the automation SW runs (=processing device). In this case, of course, the real-time clock must not be influenced, in order to ensure correct data acquisition. On the other hand, under certain circumstances, the operating system does not permit a change to be made to the system time, e.g. a PC-internal clock generator or an external network time, e.g. from a Windows active directory service. The signals or data of these two systems are nevertheless to be combined temporally with one another.

The local absolute time $TZ_{RT}$ in the real-time system is once again formed in accordance with the above relationship, $TZ_{RT} = t_0 + T_{CM} * CMT$. In this case, to is once again a start time at the beginning of the clocking of the associated time level by the associated synchronization source, CMT is the number of clock cycles since the beginning of the clocking (e.g. a counter reading of a counter) and $T_{CM}$ is the time constant of the clocking of the real-time system with which CMT is incremented.

In order to convert this real time $TZ_{RT}$ into a non-real time $TZ_{NRT}$ of the non-real-time time level, to is set at the beginning to the current value of the non-real time $TZ_{NRT}$, that is to say that $t_0 = TZ_{NRT}$. The time reference for the entire system (processing device) is then the non-real time $TZ_{NRT}$. In order to take account of the different synchronization sources of the real-time time level and of the non-real-time time level, which can also diverge from one another, it is then also necessary to adapt the time constant $T_{CMRT}$ of the real-time time level to the local absolute time of the non-real-time time level $TZ_{NRT}$. This adaptation is effected e.g. in accordance with the relationship $T_{CMRT}=(TZ_{NRT}-T_0)/CMT$. Thus, an instant of the real-time time level can then be continuously converted into a corresponding instant of the non-real-time time level, wherein the output data in the processing device of course still also remain in the real-time time level, that is to say synchronous with the synchronization source of the real-time time source.

In this case, the time constant $T_{CM}$ is adapted continuously and this results in an adaptive conversion of the local real time $TZ_{RT}$ into a non-real time $TZ_{NRT}$. This conversion is therefore also able to cope with discontinuities, such as e.g. time jumps (e.g. as a result of the changeover from summertime to wintertime), of the non-real time $TZ_{NRT}$, since in such a case the conversion is simply readjusted by the adaptation. In this case, the time resulting from the conversion nevertheless rises strictly monotonically.

The above-described conversion functions analogously, of course, between any desired time levels, that is to say not just between a real-time time level and a non-real-time time level. For this purpose, in the above relationships, it is merely necessary, for generalization, to replace $TZ_{RT}$ with the general TZ1 and $TZ_{NR}$ with the general TZn, where TZ1 and TZn denote the absolute time of an arbitrary first and second time level TL1 and TLn.

The above explanations concerning conversion and importing were always given just with regard to two time levels. It goes without saying, however, that the method according to the invention can be extended to an arbitrary number of time levels. An arbitrary number of signals or data of arbitrary other time levels can be imported into each time level and processed.

The invention claimed is:

1. Method for processing, in a processing device, data or signals from first and second independent synchronization sources, the method comprising
    introducing, in the processing device, a first time level for the first independent synchronization source and a second time level for the second independent synchronization source,
    using a clock from the first independent synchronization source as a source clock in the first time level and a clock from the second synchronization source as a source clock in the second time level,
    handling the data or signals assigned to each synchronization source synchronously with the source clock of each synchronization source in the associated time level,
    importing the signals or data of the first time level into the second time level, and
    handling, in the second time level and synchronously with the source clock of the second time level, the imported signals or data of the first time level;
    wherein the handling includes combining, in the second time level, the signals or data from the second time level and the imported signals or data to form a new signal or datum that is in synchronization with the source clock of the second time level; and
    wherein the clock from the first independent synchronization source is independent from the clock from the second synchronization source; and, during handling of the imported signals or data from the first time level in the second time level, the data or signals from the first time level continue to exist in the first time level of the processing device in synchronization with the source clock of the first time level.

2. Method according to claim 1, further comprising sampling the signal or datum to be imported using the source clock of the second time level into which the signal or datum is to be imported.

3. Method according to claim 1, comprising interpolating the signal or datum to be imported to the source clock of the second time level into which the signal or datum is to be imported.

4. Method according to claim 1, wherein a local absolute time is formed in a time level.

5. Method according to claim 4, wherein local absolute times are formed in accordance with a relationship $TZ=t_0+T_{CM}*CMT$, where TZ indicates local absolute time, $t_0$ indicates a start time, $T_{CM}$ indicates a time constant, and CMT indicates a number of clock cycles that have elapsed since the start time.

6. Method according to claim 5, comprising importing data or signals of the first time level into the second time level by converting a local absolute time of the first time level into a local absolute time of the second time level.

7. Method according to claim 6, comprising converting the local absolute time of the first time level into the local absolute time of the second time level by adapting a time constant of the first time level to the local absolute time of the second time level.

8. Method according to claim 7, wherein the adaptation is carried out in accordance with a relationship $T_{CM}=(TZ-t_0)/CMT$.

9. Method according to claim 8, wherein the start time is initialized to the local absolute time of the second time level.

10. Processing device for processing data or signals from different synchronization sources, the processing device comprising
    an input interface, via which the data or signals can be input, and
    a computation unit, in which a respective time level is provided for each synchronization source,
    wherein a clock from each synchronization source is used as a respective independent source clock in each time level, and the data or signals assigned to each synchronization source can be handled synchronously with the respective independent source clock of each synchronization source in the associated time level of the computation unit, and
    wherein in the computation unit, two signals or data of different time levels can be combined with one another by importing the signals or data of a first time level into a second time level and combining the signals or data in said second time level; and, the signals or data of the first time level remain accessible from the first time level of the processing device via an output interface.

11. Processing device according to claim 10, including an import device in the computation unit, said import device being used to sample the signal or datum to be imported using the source clock of the second time level into which the signal or datum is to be imported.

12. Processing device according to claim 10, including an import unit in the computation unit, said import unit being used to interpolate the signal or datum to be imported to the source clock of the second time level into which the signal or datum is to be imported.

13. Processing device according to claim 12, wherein in the computation unit a local absolute time is formable in each time level.

14. Processing device according to claim 13, wherein in the computation unit local absolute times are formable in accordance with a relationship $TZ=t_0+T_{CM}*CMT$, where TZ indicates local absolute time, $t_0$ indicates a start time, $T_{CM}$ indicates a time constant, and CMT indicates a number of clock cycles that have elapsed since the start time.

15. Processing device according to claim 14, including an import unit in the computation unit, said import unit being used to import data or signals of the first time level into the second time level by converting a local absolute time of the first time level into a local absolute time of the second time level.

16. Processing device according to claim 15, wherein the local absolute time of the first time level is converted in the import unit into the local absolute time of the second time level by adapting a time constant of the first time level to the local absolute time of the second time level.

17. Processing device according to claim 16, wherein the adaptation can be carried out in the import unit in accordance with a relationship $T_{CM}=(TZ-t_0)/CMT$.

18. Processing device according to claim 17, wherein the start time is initialized in the computation unit to the local absolute time of the second time level.

19. A method for processing data or signals, the method comprising:
providing a first device, the first device including a first clock;
providing a second device, the second device including a second clock;
providing a processing device, the processing device including a first level and a second level;
using the first clock as a source clock in the first level;
using the second clock as a source clock in the second level;
providing data or signals from the first device to the first level;
handling, in the first level, the data or signals from the first device synchronously with the source clock of the first level and synchronously with the first clock;
providing data or signals from the second device to the second level;
handling, in the second level, the data or signals from the second device synchronously with the source clock of the second level and synchronously with the second clock;
importing, from the first level to the second level, data or signals handled in the first level; and
combining, in the second level, data or signals handled in the second level with the imported data or signals handled in the first level,
wherein the first clock and the second clock are not temporally related to each other; the data or signals from the first device are synchronized with the first clock; the data or signals from the second device are synchronized with the second clock; and, after importing data or signals handled in the first level to the second level, the data or signals handled in the first level continue to exist in the first level of the processing device.

20. The method of claim 1, wherein the first device comprises an engine test bed synchronized with the first clock, and the second device comprises an engine control unit synchronized with the second clock.

* * * * *